(12) United States Patent
Akamine et al.

(10) Patent No.: US 7,064,612 B2
(45) Date of Patent: Jun. 20, 2006

(54) HIGH FREQUENCY POWER AMPLIFICATION ELECTRIC PART AND WIRELESS COMMUNICATION SYSTEM

(75) Inventors: Hitoshi Akamine, Maebashi (JP); Seikou Ono, Komoro (JP); Masashi Maruyama, Komoro (JP)

(73) Assignees: Hitachi, Ltd., Tokyo (JP); Akita Electronics Systems Co., Ltd., Akita (JP)

( * ) Notice: Subject to any disclaimer, the term of this patent is extended or adjusted under 35 U.S.C. 154(b) by 0 days.

(21) Appl. No.: 10/682,250

(22) Filed: Oct. 10, 2003

(65) Prior Publication Data

US 2004/0135633 A1 Jul. 15, 2004

(30) Foreign Application Priority Data

Oct. 18, 2002 (JP) ............................. 2002-303920

(51) Int. Cl.
*H03G 3/30* (2006.01)
(52) U.S. Cl. .................. 330/285; 330/129; 330/133
(58) Field of Classification Search .............. 330/129, 330/133, 134, 279, 285
See application file for complete search history.

(56) References Cited

U.S. PATENT DOCUMENTS

| 6,172,567 B1 * | 1/2001 | Ueno et al. ............ 330/285 |
| 6,492,872 B1 * | 12/2002 | Fujioka et al. ............ 330/285 |
| 6,605,999 B1 * | 8/2003 | Matsushita et al. ......... 330/285 |
| 2001/0040481 A1 | 11/2001 | Ueno et al. ................. 330/285 |

FOREIGN PATENT DOCUMENTS

| JP | 2000-523757 | 10/1999 |
| JP | 2000-151310 | 5/2000 |
| WO | WO99/29037 | 10/1999 |

OTHER PUBLICATIONS

"Basis of Microwave and Its Application", Sogo Electrics Press, Jun. 10, 1995, pp. 185-198.
"Electronic Material", Institute for Industrial Research, Apr. 1999, pp. 91-95.

* cited by examiner

*Primary Examiner*—Khanh Van Nguyen
(74) *Attorney, Agent, or Firm*—Mattingly,Stanger,Malur & Brundidge, P.C.

(57) ABSTRACT

The present invention provides a high frequency power amplification circuit capable of preventing an output power and current consumption from being largely changed even when a load fluctuates in a wireless communication system for detecting an output level necessary for feedback control by a current detecting method. In a high frequency power amplification circuit as a component of a wireless communication system which detects an output level necessary for feedback control by a current detecting method, a capacitive element is interposed between the drain terminal of a power amplification transistor in the final stage and the gate terminal of a transistor constructing a current mirror circuit in a circuit for detecting an output level, and a change in an output power accompanying load fluctuation is reflected in a detection current of the output level detecting circuit.

16 Claims, 7 Drawing Sheets

HIGH FREQUENCY POWER AMPLIFICATION ELECTRIC PART AND WIRELESS COMMUNICATION SYSTEM

BACKGROUND OF THE INVENTION

The present invention relates to a technique effectively applied to a high frequency power amplification circuit which is used for a wireless communication system such as a portable telephone, amplifies a high frequency signal, and outputs the amplified signal, and to an electric part in which the high frequency power amplification circuit is assembled. More particularly, the invention relates to a technique effectively used for reducing fluctuation of an output power and current consumption accompanying load fluctuation in a wireless communication system having a detection circuit for detecting the output level necessary for output power feedback control by a current detecting method.

Generally, a high frequency power amplification circuit for amplifying a modulated signal is assembled in a transmitting unit in a wireless communication system (mobile communication system) such as a portable telephone. In a conventional wireless communication system, to control the amplification factor of a high frequency power amplification circuit in accordance with a transmission request level from a baseband circuit or a control circuit such as a microprocessor, the output level of the high frequency power amplification circuit or an antenna is detected and fed back (refer to, for example, Japanese Unexamined Patent Publication No. 2000-151310). Hitherto, the output level is generally detected by using a coupler, a detector, or the like. The detector is often constructed as a semiconductor integrated circuit separate from the high frequency power amplification circuit.

The coupler is a device for detecting an output level via a capacitance formed between an output line (microstrip line) formed on a discrete part or an insulating substrate (module substrate) and a conductor disposed in parallel with the output line. The size of the coupler is larger than that of a device formed on a semiconductor chip. A directional coupler is described in, for example, "Basics and applications of microwaves", Sogo Electronics Press, Jul. 10, 1997, pp. 191 to 193. Aceramic-stacked-layerlow-pass filter formobile communication and a directional coupler are described in "Electronic Materials", Kogyo Chosakai, Publishing Co., Ltd., April issue, 1999, pp. 91 to 95.

Since a number of semiconductor integrated circuits and electronic parts are used separately from the high frequency power amplification circuit in the conventional method of detecting the output level of the high frequency power amplification circuit, it is difficult to reduce the size of the module. Further, in the case of using a coupler, a reference voltage may be applied to an end of the coupler in order to improve detection sensitivity. In this case, since it is necessary to optimally set the reference voltage and adjust a voltage or the like according to variations in parts, a problem occurs such that a burden on a set maker increases. When the coupler is used, a problem of power loss arises.

Further, as a portable telephone of recent years, a dual-band portable telephone is proposed, which can deal with a signal of, not only a system called GSM (Global System for Mobile Communication) using frequencies in the band of 880 to 915 MHz but also a system such as DCS (Digital Cellular System) using frequencies in the band of 1,710 to 1785 MHz. In a high frequency power amplification module used for such a portable telephone, an output power amplifier is also provided according to each band, so that a coupler for detecting the output level of the output power amplifier is also necessary for each of the bands. Therefore, it becomes more difficult to reduce the size of the module.

The applicant of the present invention consequently has achieved and applied an invention (Japanese Patent Application No. 2000-523757) of a wireless communication system of a current detecting method, which includes a transistor for output detection for receiving an input signal of a power amplification transistor for amplifying a high frequency signal and passing current proportional to current flowing in the power amplification transistor, and a current mirror circuit for transferring the current of the transistor. The current transferred from the current mirror circuit is converted to a voltage, and the voltage is used as an output level detection signal. The output level detection signal is compared with a transmission request level and, on the basis of the result, the output level is controlled.

[Patent document 1]

Japanese Unexamined Patent Publication No. 2000-151310

SUMMARY OF THE INVENTION

FIG. 7 is a diagram showing an output unit of a high frequency power amplification circuit and an output level detecting circuit ODT of a current detecting method in a wireless communication system of a current detecting method developed by the applicant of the present invention.

Shown in FIG. 7 are a power amplification transistor TR3 for amplifying a high frequency signal Pin, a transistor TR4 for output detection having a gate terminal to which the same signal Pin as that in the transistor TR3 is applied via a resistor R2 and having a size which is 1/n of the transistor TR3, a transistor TR5 for a current mirror circuit, which is connected in series to the transistor TR4 via a resistor R3, a transistor TR6 connected to the transistor TR5 to form a current mirror circuit with the transistor TR5, and a sense resistor R4 for current-voltage conversion connected between the drain terminal of the transistor TR6 and the ground point. Since current of 1/n of a drain current Idd of the power amplification transistor TR3 flows in the transistor TR4, a voltage Vdet obtained by the conversion of the sense resistor R4 serves as a voltage correlated with the output power of the power amplification transistor TR3.

The detected voltage is supplied to a comparator CMP and is compared with an output level instruction signal Vramp supplied from a baseband circuit or a control circuit such as a microprocessor. A voltage or current according to the input potential difference is supplied to a bias generating circuit BIAS where a gate bias voltage for the power amplification transistor TR3 is generated, thereby controlling the output level. In FIG. 7, C1 denotes a capacitive element for blocking a direct current component of the input high frequency signal Pin, and MN4 indicates an impedance matching circuit for performing matching so that an impedance at an output terminal becomes 50 Ω. The power amplification transistor TR3 may be provided, not necessarily in one stage, in a plurality of stages.

The inventor herein and others have examined the influence by the load fluctuation on the high frequency power amplification circuit of the current detecting method of FIG. 7. Concretely, changes in an output power Pout and changes in current consumption when the phase of an impedance of a circuit at a post stage of the drain terminal of the power amplification transistor TR3 while changing a load Z0. As a result, as shown by a broken line in each of FIGS. 5 and 6, it was clarified that the output power Pout and the current consumption largely fluctuate according to the phase.

The current consumption denotes here the sum of the drain current Idd of the transistor TR3 and the current (Ic1+Ic2) of the output level detecting circuit. In the circuit of FIG. 7, even when the load Z0 is changed, the influence is not exerted on the output of the output level detecting circuit ODT. Consequently, it is considered that most of the fluctuation amount of the current consumption is the fluctuation amount of the drain current Idd of the power amplification transistor TR3. On the other hand, the detected voltage Vdet obtained when the load Z0 is changed is almost constant as shown in FIG. 4.

It was found from the above that, in the circuit of FIG. 7, although the output power and the current consumption largely fluctuate when the load fluctuates, the detected voltage Vdet hardly changes, so that the feedback control in the current detection method as shown in FIG. 7 has a problem such that, when the load fluctuates, the output power and the current consumption cannot be controlled to a desired level. Increase in the output power and current consumption in the high-frequency power amplification circuit causes destroy of an element in the circuit or considerable exhaustion of a battery. It is therefore feared that, in the wireless communication system such as a portable telephone using the high frequency power amplification circuit, the reliability deteriorates and the maximum conversation time and the maximum standby time becomes shorter than expected.

The reason why the load is fluctuated is that the environment in which the system such as a portable telephone may change in a case such that the portable telephone is put on a metal plate, so that tests on assumption of such environmental changes are necessary. FIGS. 5 and 6 show changes in the output power and changes in the current consumption, respectively, when the load is set to a state close to ground short circuit and the phase of the impedance is changed in order to obtain results of tests in a state close to a situation where the portable telephone is put on a metal plate.

An object of the invention is to provide a high frequency power amplification electric part capable of preventing an output power and current consumption from largely fluctuating even when a load fluctuates in a wireless communication system for detecting an output level necessary for an output power feedback control by a current detecting method, and a wireless communication system using the same.

Another object of the invention is to provide a high frequency power amplification electric part realizing high reliability, long maximum conversation time and long standby time when applied to a wireless communication system, and a wireless communication system using the same.

The above and other objects and novel features of the invention will become apparent from the description of the specification and the appended drawings.

An outline of a representative invention out of inventions disclosed in the specification will be described as follows.

In a high frequency power amplification electric part as a component of a wireless communication system which detects an output level necessary for feedback control of output power by a current detecting method, a capacitive element is interposed between the drain terminal of a power amplification transistor in the final stage and a proper node such as the gate terminal of a transistor constructing a current mirror circuit in a circuit for detecting an output level, and a change in the output power accompanying load fluctuation is transmitted to the inner node of the output level detecting circuit via the capacitive element and is reflected in a detection current of the output level detecting circuit.

By the means, also in the case of detecting the output level by the current detecting method, a change in the output power accompanying load fluctuation is reflected in the detection current of the output level detecting circuit. Consequently, the output power can be controlled more accurately, and undesired events such as destroy of an element in the circuit or considerable exhaustion of a battery due to temporary increase in the current consumption can be avoided.

The capacitive element for reflecting a change in the output power into the detection current of the output level detecting circuit has, preferably, a capacitance value of 1 pF or larger. When the capacitance value is too small, fluctuation in the output power accompanying load fluctuation cannot be sufficiently transmitted to a feedback control system, so that the fluctuation in the output power cannot be suppressed to a desired level or less.

On the other hand, when the capacitance value is too large, it is not preferable for the following reason. Change in the output power is further added to a relatively small change in an output level detected from an input signal when the output power level is low. The feedback control system excessively reacts with the fluctuation in the output power. In addition, it becomes difficult to reduce the size of a semiconductor chip and a module. A proper maximum value of the capacitive element for transmitting change in the output power is, although it depends on the constant of a device of the circuit and the like, about 2 to 4 pF.

DESCRIPTION OF THE PREFERRED EMBODIMENTS OF THE INVENTION

Preferred embodiments of the invention will be described hereinbelow with reference to the drawings.

Prior to the invention, the inventor herein and the others have examined why the drain current of a transistor for power amplification largely changes due to a load fluctuation. First, the examination will be described.

Figure 1:
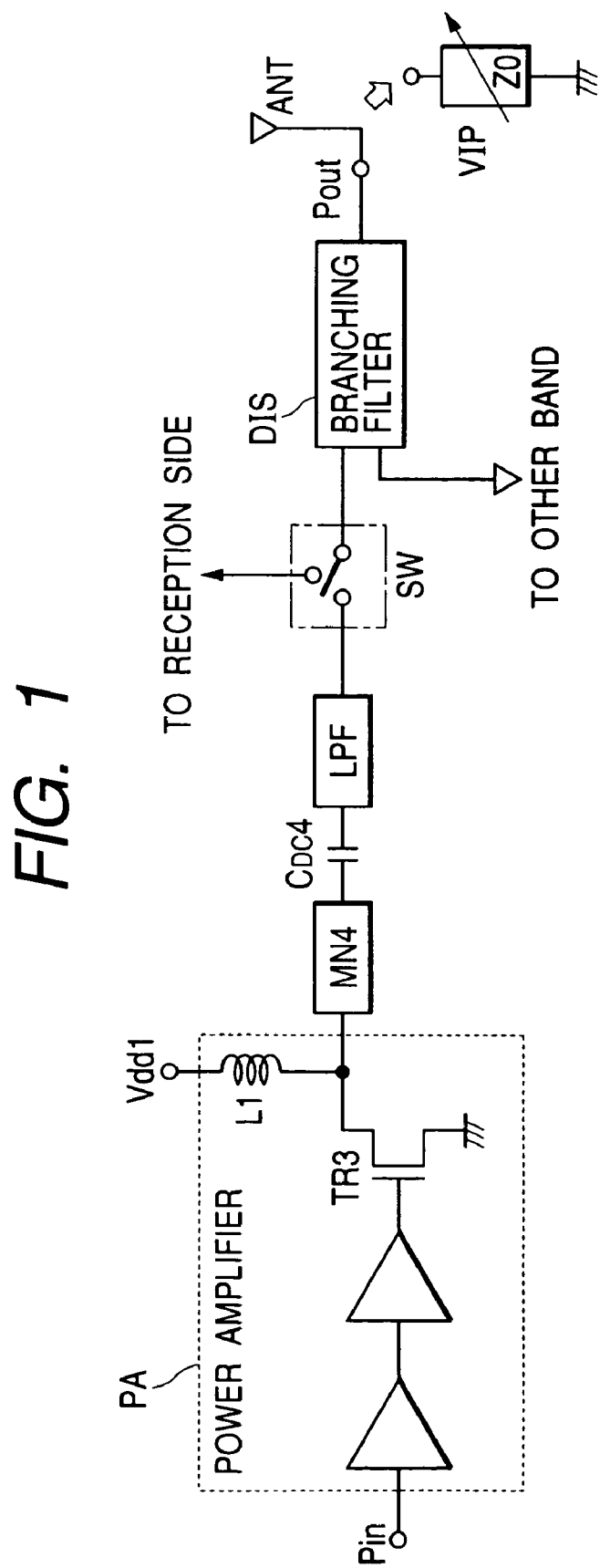
FIG. 1 is a block diagram schematically showing a transmission circuit examined by the inventor and the others.

FIG. 1 schematically shows a transmission circuit examined by the inventor herein and the others. Shown in FIG. 1 are: an antenna ANT for transmission/reception; an output power amplifier PA for amplifying an input high frequency signal Pin and driving the antenna ANT, constructed by three amplification stages which are cascaded; a transistor TR3 for power amplification serving as the final amplification stage; an inductance element L1 connected between a power source voltage terminal Vdd1 and the drain terminal of the transistor TR3 for power amplification; an impedance matching circuit MN4; a capacitive element CDC4 for blocking a direct current component; a low pass filter LPF for blocking harmonics components of a transmission signal, a transmission/reception change-over switch SW; and a branching filter DIS for branching a reception signal into a GSM signal of 900 MHZ or the like and a DCS signal of 1800 MHZ or the like.

In place of the inductance element L1, a λ/4 transmission line having an electric length of ¼ wavelength of a fundamental wave may be used. As the transistor TR3 for power amplification, a MOSFET is used in the embodiment of FIG. 1 but another transistor such as a bipolar transistor, GaAs MESFET, heterojunction bipolar transistor (HBT), HEMT (High Electron Mobility Transistor), or the like may be used.

In the transmission circuit as shown in FIG. 1, each of the impedance of an antenna terminal to which the antenna ANT is connected, the impedance of a connection node between the low pass filter LPF and the transmission/reception change-over switch SW, and the impedance of a connection node between the transmission/reception change-over switch SW and the branching filter DIS is set to 50 Ω. On the other hand, the impedance of the drain terminal of the transistor TR3 for power amplification is set to a considerably low value (a few Ω) so that a desired power is obtained at the output terminal (antenna terminal) of which impedance is 50 Ω. To match the impedance of the drain terminal of the transistor TR3 for power amplification with the impedance at the antenna terminal, the impedance matching circuit MN4 is provided.

In actual circuit designing, an operation point of the drain terminal of the transistor TR3 for power amplification when the maximum power is obtained at the output terminal and an operation point of the drain terminal of the transistor TR3 for power amplification when the power amplification circuit PA operates at the maximum efficiency do not coincide with each other. At the stage of the circuit designing, the impedance of the drain terminal of the transistor TR3 for power amplification is determined in consideration of balance of them.

Figure 2:
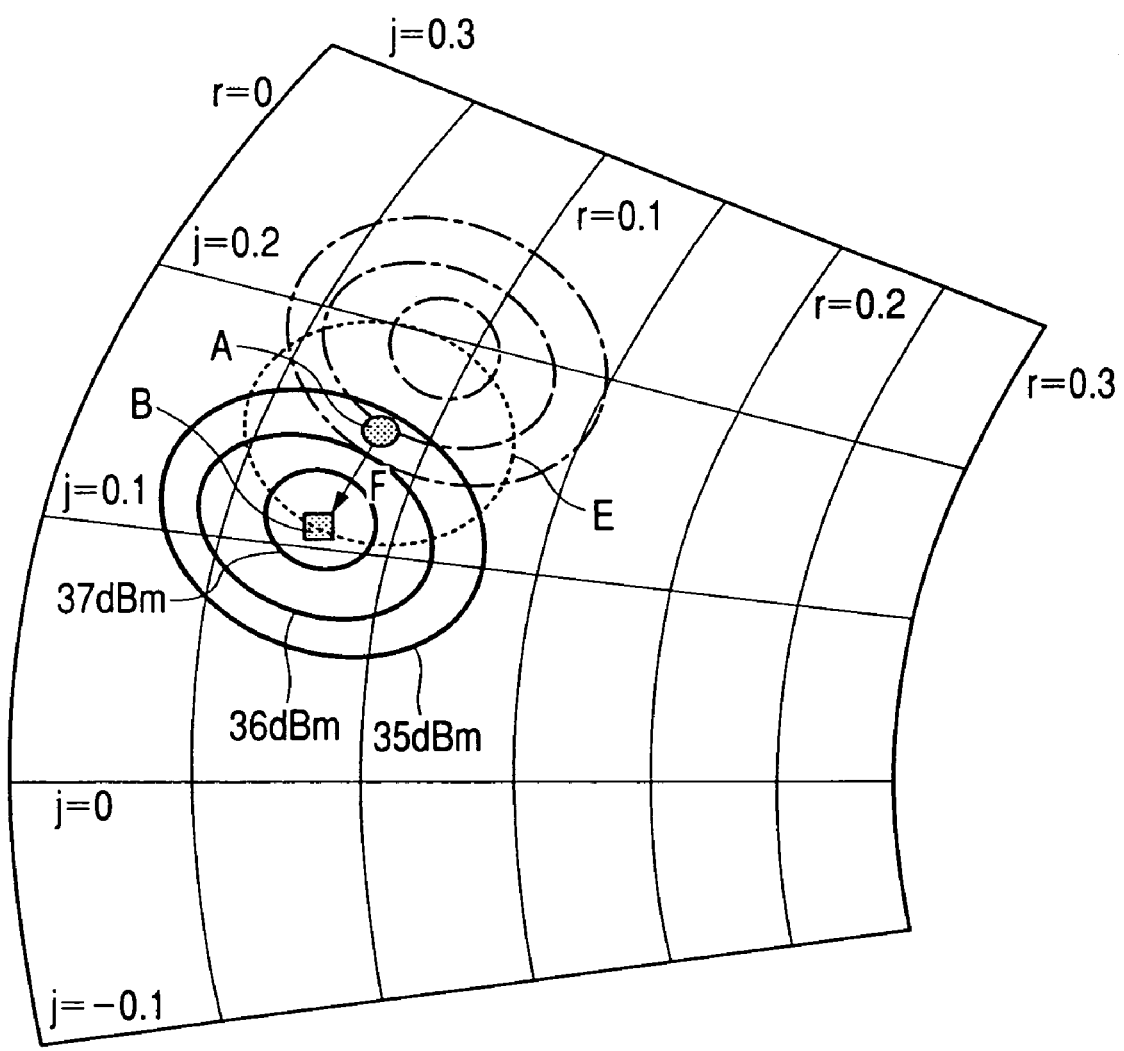
FIG. 2 is a Smith chart showing characteristics of a power amplification circuit in FIG. 1 by making the impedance when a drain terminal of a transistor TR3 for power amplification sees an antenna side and a reflection coefficient correspond to each other.

Concretely, as understood by referring to the Smith chart of FIG. 2 showing the characteristics of the power amplification circuit of FIG. 1 by making the impedance when the antenna side is seen from the drain terminal of the transistor TR3 for power amplification correspond to a reflection coefficient, power contour lines at the output terminal of the circuit are shown by solid lines and contour lines of power efficiency are indicated by alternate long and short dash lines. The power contour lines and the contour lines of power efficiency do not coincide with each other. At the time of designing a circuit, therefore, element constants of the transistor TR3 for power amplification, impedance matching circuit MN4, and the like are determined so that a point as shown by reference character A which is an almost intermediate point between the maximum power point and the maximum efficiency point becomes an operation point (optimum impedance).

When a variable impedance VIP is connected to the output terminal in place of the antenna ANT and the load Z0 is changed, the phase of the impedance when the antenna side is seen from the drain terminal of the transistor TR3 for power amplification changes, a change occurs in the reflection coefficient and the like, and the output power fluctuates. When the output power fluctuates, the drain current of the transistor TR3 for power amplification increases so as to obtain the output power. On the Smith chart of FIG. 2, the impedance when the load is changed changes in a concentric circle having the operation point as a center as shown by a broken line E. A point on the circle shown by the broken line E is determined by the phase of the impedance at that time. Thus, the inventor herein and the others have reached a conclusion that when the load changes and the operation point of the circuit moves to the maximum power point B as shown by an arrow F (when the phase of the impedance is 160°), the drain current of the transistor TR3 for power amplification increases the most.

Figure 3:
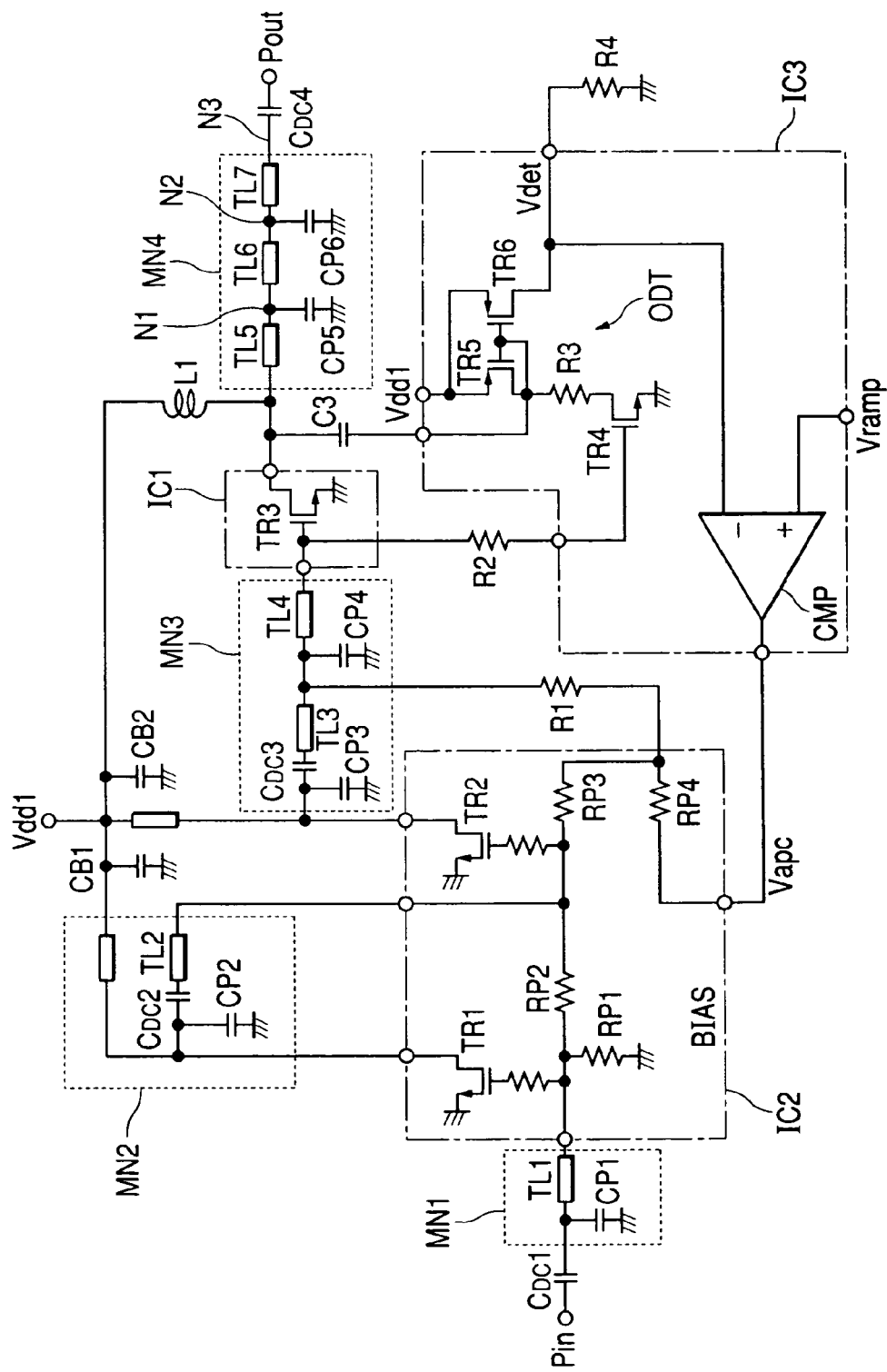
FIG. 3 is a circuit diagram showing an embodiment of the high frequency power amplification circuit according to the invention.
Figure 4:
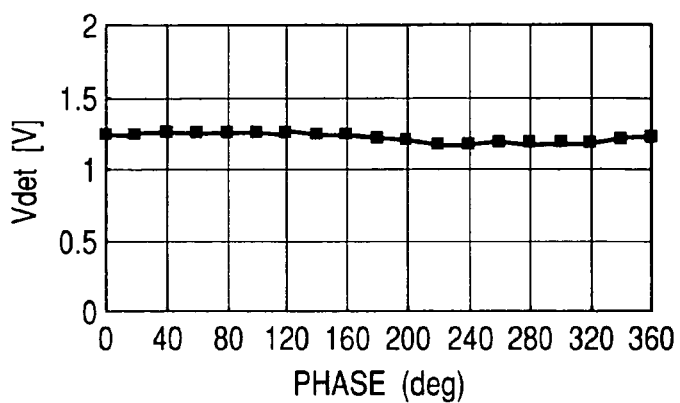
FIG. 4 is a graph showing the relation between the phase of an impedance and a detected voltage Vdet when the load Z0 of the high frequency power amplification circuit is changed.

From the examination, it was considered that when the change in the output power Pout accompanying fluctuation in the load is transmitted to the output level detecting circuit ODT, an increase in the drain current of the transistor TR3 for power amplification accompanying the load fluctuation can be suppressed, and the circuit as shown in FIG. 3 has been invented.

Shown in FIG. 3 are a transistor TR1 for power amplification in a first amplification stage for amplifying a high frequency signal Pin, a transistor TR2 for power amplification in a second amplification stage, a transistor TR4 for output detection taking the form of a MOSFET in which the same signal Pin as that in the transistor TR3 for power amplification in the final amplification stage is applied via a resistor R2 to the gate terminal, a transistor TR5 for a current mirror, which is connected in series to the transistor TR4 via a resistor R3, a transistor TR6 connected to the transistor TR4 to form a current mirror, and a sense resistor R4 for current-voltage conversion connected between the drain terminal of the transistor TR6 and the ground point.

The transistor TR4 for output detection is formed in a size which is 1/n of the transistor TR3 for power amplification, a current of 1/n of the current flowing in the transistor TR3 for power amplification flows in the transistor TR4, and the current is transferred from the current mirror circuit so as to be passed to the sense resistor R4. Consequently, the detected voltage Vdet obtained by conversion in the sense resistor R4 becomes a voltage correlated with the output power of the transistor TR3 for power amplification.

The detected voltage Vdet is supplied to a comparator (error amplifier) CMP and is compared with an output level instruction signal Vramp supplied from a baseband circuit or the like. A voltage Vapc according to the potential difference between Vdet and Vramp is output from the comparator CMP. The gains of the amplification stages are controlled so that a voltage obtained by dividing the voltage Vapc by resistors RP1 to RP4 is applied as a bias voltage to the gate terminals of the transistors TR1 to TR3 for power amplification in the stages, and a desired output level is obtained.

In FIG. 3, CDC1, CDC2, and CDC3 denote capacitive elements for blocking a direct current component, and MN1 to MN4 indicate impedance matching circuits constructed by capacitors CP1 to CP6 and transmission lines TL1 to TL7. The size (gate width) of the transistor TR4 for output detection is set to a fraction of tens of the size of the transistor TR3 for power amplification and it is designed so that the current of the transistor TR3 becomes few tens mA when the drain current Idd of the transistor TR3 for power amplification is a few A (Ampere). The size ratio between the transistors TR5 and TR6 for a current mirror is almost 1:1. With the configuration, the current flowing in the output level detection circuit ODT is set to a value much smaller than the drain current Idd of the transistor TR3 for power amplification.

In the high frequency power amplification circuit of the embodiment, a capacitor C3 for transmitting a change in the output power in the form of an AC signal to the output level detecting circuit ODT is provided between the drain terminal of the transistor TR3 for power amplification and the gate terminals of the transistors TR5 and TR6 for current mirror constructing the output level detecting circuit ODT. By providing the capacitor C3, also in the case where the output level is detected by the current detecting method, a change in the output power accompanying fluctuation in the load is reflected in the detection current of the output level detecting circuit ODT, so that the output power can be controlled more accurately.

With the configuration, for example, when the drain current Idd of the transistor TR3 for power amplification increases as the output power accompanying the load fluctuation increases, a change in the drain voltage increased accordingly is transmitted to the output level detecting circuit via the capacitor C3. Consequently, the detection current increases, the detection voltage Vdet rises, an output of the comparator CMP decreases, and a bias circuit constructed by the resistors PR1 to PR4 changes the bias in the direction of decreasing the drain current Idd of the transistor TR3 for power amplification. As a result, increase in the drain current Idd of the transistor TR3 for power amplification due to increase in the output power can be suppressed.

In the embodiment, the capacitor C3 for transmitting a change in the output power to the output level detecting circuit ODT is connected between the drain of the transistor TR3 for power amplification and the gate terminal of the transistor TR5 in the current mirror circuit of the output level detecting circuit ODT. One of the terminals of the capacitor C3 may be connected to any node (in FIG. 3, a connection node N1 between the transmission line TL5 and the capacitor CP5, a connection node N2 between the transmission line TL6 and the capacitor CP6, or a connection node N3 between the transmission line TL7 and the capacitor CDC4) as long as the node lies between the drain terminal of the transistor TR3 for power amplification and the capacitor CDC4 for blocking the direct current on the output terminal side. The most desirable position in which the capacitor C3 is connected is between the drain terminal of the transistor TR3 for power amplification and the gate terminal of the transistor TR5 constructing the current mirror circuit.

A method of determining the capacitance value of the capacitor C3 will now be described.

When the capacitance value of the capacitor C3 is too small, fluctuation in the output power accompanying the load fluctuation cannot be sufficiently transmitted to the feedback control system, so that the fluctuation in the output power accompanying the load fluctuation cannot be sufficiently suppressed. On the other hand, when the capacitance value of the capacitor C3 is too large, a change in the output power is added to a relatively small change in the output level detected from input information when the output power level is low, and the feedback control system excessively reacts with the fluctuation in the output power.

Specifically, although the output power is feedback controlled by the current detecting method in place of the conventional output power detecting method using a coupler, when the capacitor C3 is large, it works like the coupler. Consequently, the feedback control system excessively reacts with the fluctuation in the output power, and it is feared that the fluctuation width of the output power becomes wider. When the capacitance value is too large, it becomes difficult to reduce the size of a semiconductor chip and a module. Therefore, a too large capacitance value is not preferable. Although it depends on the constant of an element of the circuit or the like, it is desirable to set the maximum value of the capacitor C3 to about 2 to 4 pF.

In the circuit of the embodiment, 1 pF is selected as the minimum capacitance value effective to suppress the fluctuation level of the output power accompanying the load fluctuation to a desired level such as 35 dBm or less. The maximum value of the capacitor C3 is set to 2 pF from the above-described viewpoint. The capacitance value of the capacitor C3 necessary to obtain an effect of suppressing the fluctuation in the output power accompanying the load fluctuation by applying the invention varies according to the configurations of the circuits provided between the drain terminal of the transistor TR3 for power amplification and the terminal of the antenna, such as the final amplification stage including the transistor TR3 for power amplification and the impedance matching circuit MN3, the constant of each of the elements of the circuits, and the like. The capacitance value of the capacitor C3 is not limited to the range of 1 to 2 pF but may be determined according to a circuit to which the invention is applied.

Figure 5:
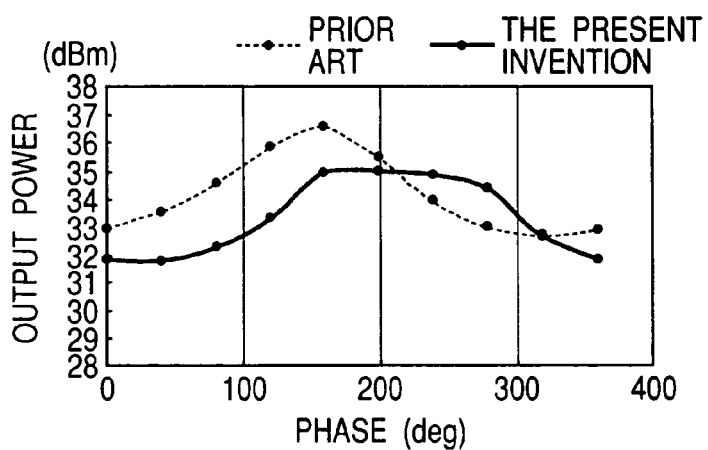
FIG. 5 is a graph showing the relation between the phase of an impedance and an output power when the load Z0 of the high frequency power amplification circuit is changed.

As an example, the solid line in FIG. 5 shows the result of simulation of the level fluctuation of an output power Pout accompanying the load fluctuation when the capacitance value of the capacitor C3 is set to 1pF. The broken line in FIG. 5 shows the result of simulation of the level fluctuation of the output power Pout accompanying the load fluctuation in the case where the capacitor C3 is not provided. From comparison between them, it is understood that, by applying the invention, the maximum level of the output power Pout which conventionally reaches nearly 37 dBm can be suppressed to 35 dBm or less, and the fluctuation width of the output power Pout which conventionally reaches nearly about 4 dBm can be suppressed to about 3 dBm.

Figure 6:
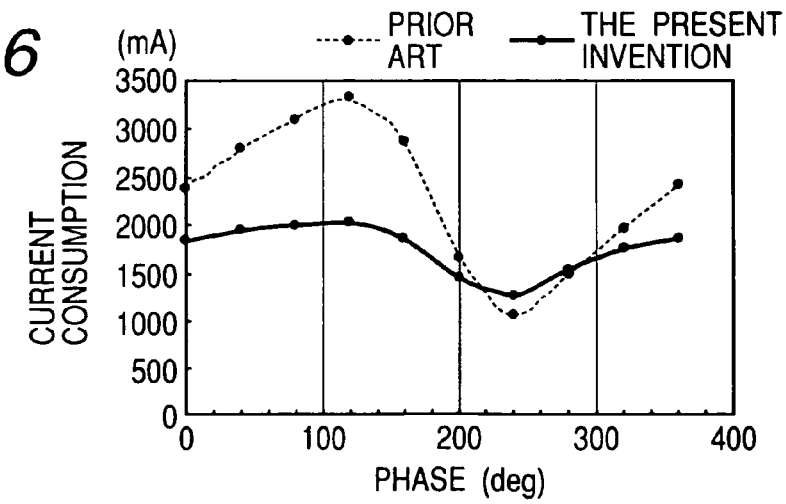
FIG. 6 is a graph showing the relation between the phase of an impedance and current consumption when the load Z0 of the high frequency power amplification circuit is changed.
Figure 7:
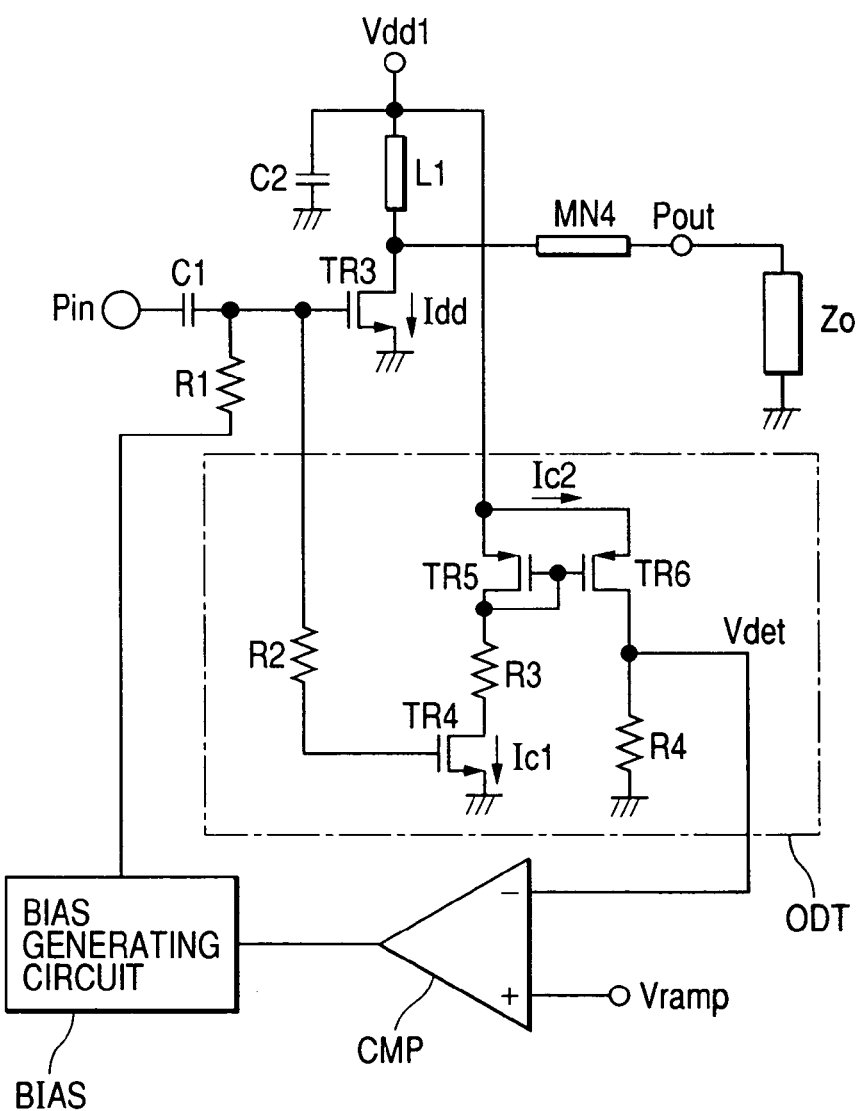
FIG. 7 is a circuit diagram showing an output unit of a high frequency power amplification circuit and an output level detecting circuit of a current detecting method in a wireless communication system of the current detecting method developed by the applicant of the present invention.

In FIG. 6, the solid shows the result of simulation of fluctuation in the consumption current of the transistor TR3 for power amplification and the output level detecting circuit ODT accompanying load fluctuation when the capacitance value of the capacitor C3 is set to 1 pF. The broken line in FIG. 6 shows the result of simulation of fluctuation in the consumption current of the transistor TR3 for power amplification and the output level detecting circuit ODT accompanying the load fluctuation in the case where the capacitor C3 is not provided. From comparison between them, it is understood that, by applying the invention, the current consumption which conventionally reaches nearly 3400 mA at the maximum can be suppressed to 2000 mA or less and the fluctuation width of the current consumption which is conventionally about 2400 mA can be suppressed to 750 mA or less.

Further, in the embodiment, the output level detecting circuit ODT is formed together with the comparator CMP on a single semiconductor chip, and the capacitor C3 for suppressing the fluctuation level of the output power accompanying the load fluctuation is provided on the outside of the chip. FIG. 3 shows that circuits and devices surrounded by alternate long and short dash lines IC1, IC2, and IC3 are formed on respective semiconductor chips.

Although not limited, in the embodiment, the whole circuit shown in FIG. 3 is constructed as a module. In the specification, a configuration that a plurality of electronic parts mounted on an insulating substrate such as a ceramic substrate on/in which print wiring is conducted are connected by the print wiring and bonding wires so that the parts play a predetermined role and can be dealt as one electronic part will be called a module.

In the circuit of the embodiment of FIG. 3, the resistors R1, R2, and R4 and the inductance L1 on the outside of IC1, IC2, and IC3 are constructed by discrete parts. The capacitors on the outside of IC1, IC2, and IC3 are constructed by discrete parts or conductive layers formed on the surface and rear face of any of a plurality of dielectric layers stacked on a module board. The transmission lines constructing the impedance matching circuits MN1 to MN4 are formed by a conductor layer made of copper or the like formed on the surface of the module board. Since the resistors R1 and R4 are requested to have relatively high precision, external resistors are used. As the resistor R2, an external resistor for enabling the ratio between the output power Pout and the output voltage (drain voltage) of the transistor TR4 for output detection (drain voltage) to be adjusted is used. The capacitor C3 for suppressing the fluctuation level of the output power accompanying the load fluctuation may be a discrete part. However, to decrease the number of parts, it is desirable to construct the capacitor C3 by the conductor layers formed on the surface and rear face of the dielectric layers.

In the case of forming the capacitor C3 of which capacitance value is 1 pF or the like by using the dielectric layer of which dielectric constant $Er=8.854\times10^{-12}$ F/rn (specific inductive capacity $S=9$) on the module substrate, if the thickness (distance between electrodes) t of the dielectric layer is 50 μm, the occupation area S is 6.4 mm² from $C=Er \cdot S/t$. The length of one side in the case of the capacity of a rectangular shape is about 0.8 mm. Therefore, a capacitive element of such a size can be sufficiently formed on the module substrate. Thus, the whole module can be constructed more compactly than the case of using a discrete part as the capacitor C3.

1 pF is a value which is not easily obtained by parasitic capacitance of the module board. Although the capacitor C3 for suppressing the fluctuation level of the output power accompanying the load fluctuation can be formed by using wire capacitance on the module board. In this case, however, the length of the wire is redundant. On the other hand, the capacitor C3 can be formed on the semiconductor chip IC3 on which the output level detecting circuit ODT and the comparator CMP are formed. In this case, however, there are disadvantages such that the size of the semiconductor chip increases and the cost is higher as compared with the case of forming the capacitor on the module substrate.

In the embodiment of FIG. 3, the resistor R2 is connected between the drain terminal of the transistor TR3 for power amplification and the gate terminal of the transistor TR4 for output detection as a component of the output level detecting circuit ODT. The resistor R2 can be omitted. Similarly, in the embodiment of FIG. 3, the resistor R3 is connected between the drain terminal of the transistor TR4 for output detection as a component of the output level detecting circuit and the drain terminal of the MOSFET TR5 for current mirror. The resistor R3 can be also omitted.

By providing the resistor R2, there is an advantage such that the ratio between the output power Pout and the output voltage (drain voltage) of the transistor TR4 for output detection can be adjusted. Therefore, as shown in the embodiment, when the resistor R2 is provided outside of the semiconductor chip, adjustment according to a system to which the invention is applied can be made. By providing the resistor R3, dependency on the power source voltage of the output level detecting circuit ODT can be reduced. Correlation between the output power Pout in the case where the resistor R3 for improving linearity and the detection current is almost linear when the power source voltage Vdd1 is at a predetermined level such as 3.5V. However, when the power source voltage Vdd1 changes to a level such as 4.2V, in an area of a high output power, the current flowing in the transistor TR4 for output detection sharply increases. When the resistor R3 is provided, even if the power source voltage Vdd1 changes, the amount of fluctuation of the drain voltage of the transistor TR4 is small. As a result, fluctuation in the current flowing in the transistor TR4 can be suppressed. As a resistance value of the resistor R3 for improving linearity, for example, about 100 Ω is proper.

Figure 8:
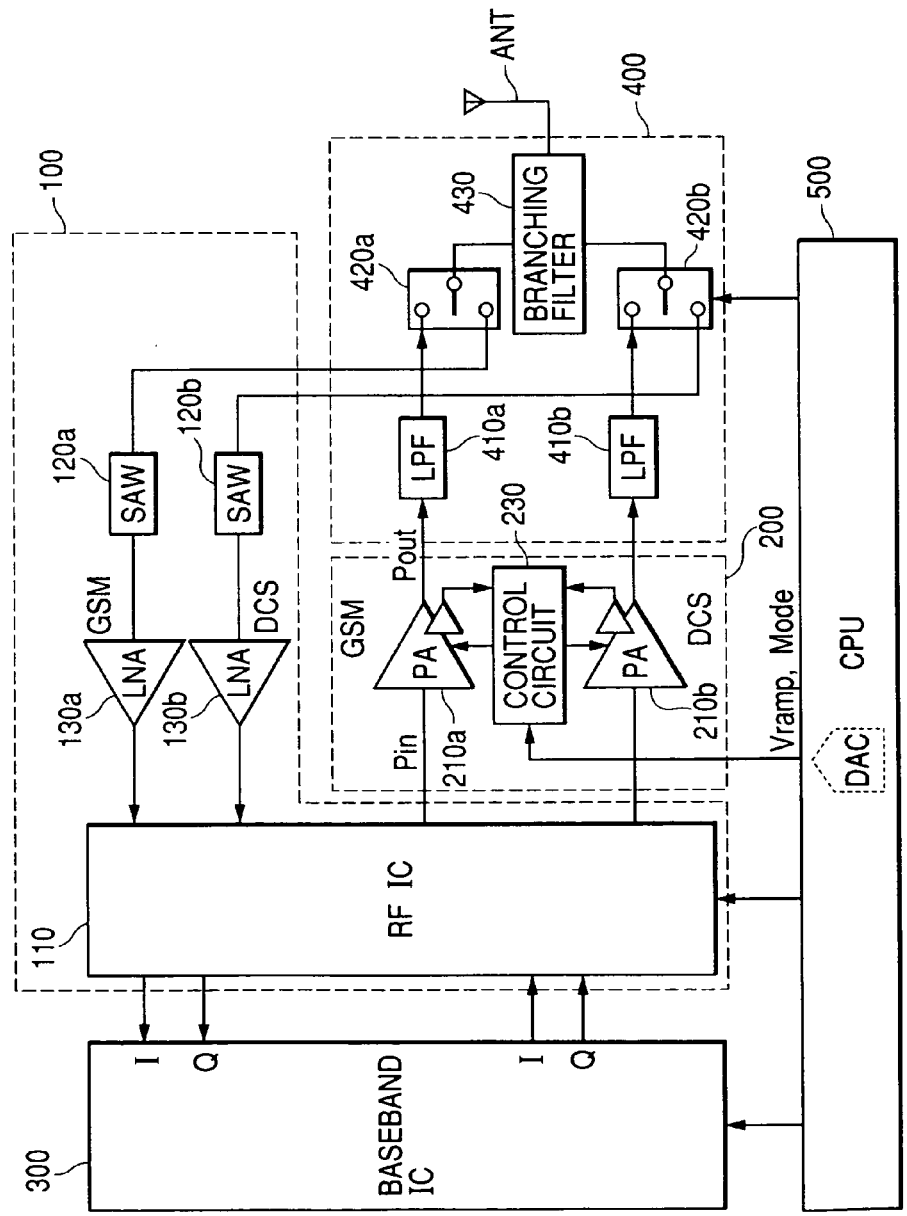
FIG. 8 is a block diagram showing the schematic configuration of a system capable of performing wireless communication of two communication systems of GSM and DCS to which the invention is applied.

FIG. 8 shows a schematic configuration of a system capable of performing wireless communications of two communication systems of GSM and DCS as an example of a wireless communication system to which the invention is applied.

In FIG. 8, 100 denotes a high frequency module (hereinbelow, called RF module) obtained by mounting a high frequency signal processing circuit (RF IC) 110 which is a semiconductor integrated circuit having a modem circuit capable of performing GMSK modulation and demodulation in a GSM/DCS system, a bandpass filter SAW such as a surface acoustic wave filter for removing unnecessary waves from a reception signal, a low noise amplifier LNA for amplifying a reception signal, and the like on a ceramic substrate. 200 indicates a module for amplifying high frequency power (hereinbelow, called power module) including a high frequency power amplification circuit (hereinbelow, called power amplifier) PA for transmitting a signal by driving the antenna ANT, an output power control circuit 230, and the like.

300 denotes a baseband circuit (hereinbelow, called baseband IC) taking the form of a semiconductor integrated circuit for generating I and Q signals on the basis of transmission data (baseband signal) and processing I and Q signals extracted from a reception signal. 400 denotes a front end module including a filter LPF for eliminating noise such as high harmonics included in a transmission signal output from the RF power module 200, a transmission/reception change-over switch, a branching filter, and the like. 500 indicates a microprocessor (hereinbelow, called CPU) for controlling the whole system by, for example, generating control signals to the RF IC 110 and the baseband IC 300 and an output level instruction signal Vramp to the power module 200. The output level detecting circuit ODT and the comparator CMP in FIG. 3 are expressed as one block as the output power control circuit 230 in FIG. 8.

As shown in FIG. 8, in the embodiment, the power module 200 has therein a power amplifier 210a for amplifying a transmission signal of 900 MHz in the frequency band of GSM and a power amplifier 210*b* for amplifying a transmission signal of 1800 MHz in the frequency band of DCS. Similarly, the RF module 100 has therein an SAW filter 120*a* and a low noise amplifier 130*a* for GSM and an SAW filter 120*b* and a low noise amplifier 130*b* for DCS.

In the RF IC 110, GMSK modulation for phase-modulating a carrier wave in accordance with information to be transmitted is performed. The phase-modulated signal is input as the high frequency signal Pin to the power module 200 and amplified. Although not particularly limited, in the embodiment, the RF IC 110 includes not only a modulation circuit for transmission but also a reception circuit constructed by a mixer for down-converting a reception signal to a low-frequency signal, a high-gain programmable gain amplifier, and the like. The low noise amplifier LNA can be provided in the RF IC 110.

The front end module 400 includes a low-pass filter 410*a* for GSM, a low-pass filter 410*b* for DCS, a change-over switch 420*a* for switching between transmission and reception of GSM, a change-over switch 420*b* for switching between transmission and reception of DCS, and a branching filter 430 which is connected to the antenna ANT and separates a signal for GSM and a signal for DCS from a reception signal. Although not shown in FIG. 8, the power module 200 or front end module 400 has an impedance matching circuit for matching impedances, which is connected between the output terminals of the power amplifiers 210*a* and 210*b* or between the transmission output terminal of the RF power module 200 and the low-pass filters 410*a* and 410*b*.

In the dual-band communication system of GSM and DCS as described above, the maximum level of the output power of the power amplifier 210*a* on the GSM side and that of the output power of the power amplifier 210*b* on the DCS side are specified by different standards and are different from each other. However, by properly setting the size ratio between the transistor TR3 for high frequency power amplification and the transistor TR4 for output detection and the size ratio between the transistors TR5 and TR6 constructing the current mirror circuit, the sense resistor R4 and the comparator CMP can be shared by the two bands.

Figure 9:
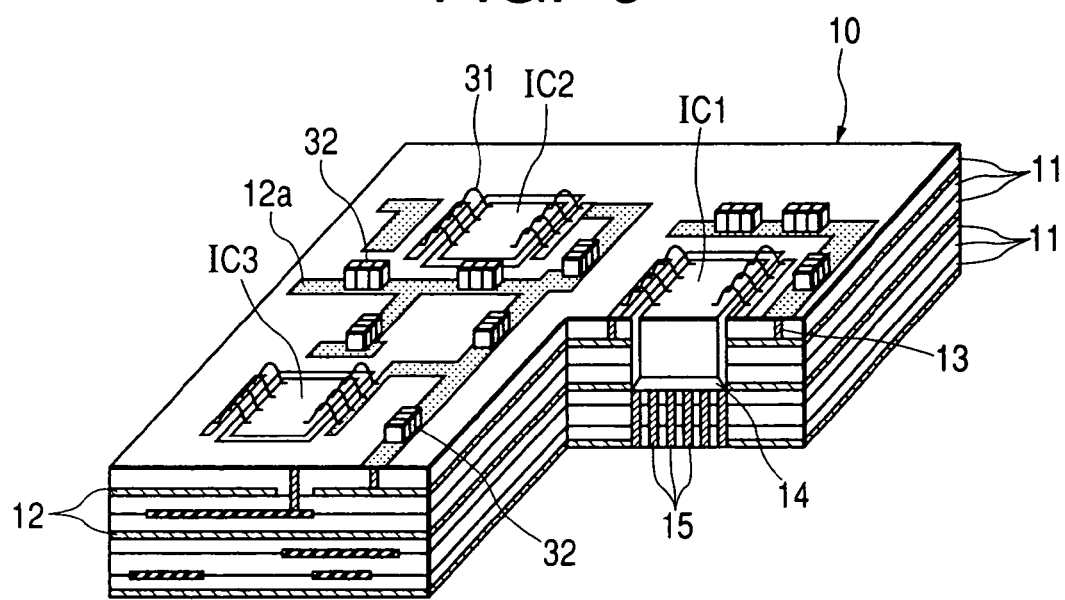
FIG. 9 is a partly-sectional perspective view showing an example of a device structure of a power module of the embodiment illustrated in FIG. 3.

FIG. 9 shows the device configuration of the power module of the embodiment. FIG. 9 is a structural diagram which does not accurately show the structure of the RF power module of the embodiment but schematically shows the structure while omitting some parts, wires, and the like.

As shown in FIG. 9, a body 10 of the module of the embodiment has a structure obtained by integrating a plurality of dielectric layers 11 which are ceramic plates made of alumina or the like by stacking. On the surface or rear face of each of the dielectric layers 11, a conductive layer 12 made of a conductor such as copper which is formed in a predetermined pattern and plated is provided. 12*a* denotes a wiring pattern made by the conductive layer 12. To connect the conductive layers 12 on the surface and rear face of the dielectric layers 11 or the wiring patterns, through holes 13 are formed in the dielectric layers 11. The through holes 13 are filled with the conductor.

In the module of the embodiment of FIG. 9, six dielectric layers 11 are stacked. On almost the whole back faces of the first, third, and six layers from above, the conductive layers 12 are formed and serve as ground layers to which the ground potential GND is supplied. The conductive layers 12 on the surface and back faces of the other dielectric layers 11 are used for constructing transmission lines and the like. By properly setting the width of the conductive layers 12 and the thickness of the dielectric layers 11, the transmission lines are formed so as to have an impedance of 50 Ω.

In the first to third dielectric layers 11, rectangular holes for mounting the semiconductor chips IC1, IC2, and IC3 are opened. Each of the ICs is inserted to the hole and fixed to the bottom of the hole by an adhesive 14. In the fourth dielectric layer 11 corresponding to the bottom of the hole and the lower dielectric layers 11, via holes 15 are formed. The via holes 15 are also filled with a conductor. The conductor in the via holes plays the role of improving heat dissipation efficiency by transmitting heat generated in the semiconductor chips IC1, IC2, and IC3 to the lowest conductive layer.

Electrodes on the top face of the semiconductor chips IC1, IC2, and IC3 and the predetermined conductive layer 12 are electrically connected to each other via bonding wires 31. On the surface of the first dielectric layer 11, the conductive pattern 12*a* constructing microstrip lines MS7, MS8, and the like are formed and a plurality of discrete parts 32 such as the capacitive elements CDC1 to CDC4 and CP1 to CPG and resistive elements R1 and R4 for constructing the power amplification circuit, the output level detecting circuit, and the like are mounted. Among the elements, the capacitive elements can be formed in the board by using the conductive layers on the surfaces and back faces of the dielectric layers 11 without using discrete parts.

Although the invention achieved by the inventor herein has been concretely described on the basis of the embodiment, obviously, the invention is not limited to the foregoing embodiment but can be variously modified without departing from the gist.

For example, in the embodiment, the power module is constructed by the semiconductor chip IC 2 including the amplification transistors TR1 and TR2 in the first and second stages and the bias circuit formed by the resistors PR1 to PR4, the semiconductor chip IC1 in which the transistor TR3 in the third stage is formed, the semiconductor chip IC3 in which the output level detecting circuit ODT and the comparator CMP are formed, and external devices such as resistors and capacitors. As the semiconductor chips IC1 and IC2, a single semiconductor chip may be used. As the semiconductor chips IC1 and IC3, a single semiconductor chip may be used. In the dual-band communication system, the transistors TR1 and TR2 for amplification in the first and second stages of GSM, the bias circuit for the transistors TR1 and TR2, the transistors TR1 and TR2 for amplification in the first and second stages of DCS, and the bias circuit for the transistors TR1 and TR2 can be formed on a single semiconductor chip.

In the high frequency power amplification circuit of the embodiment, power amplification FETs in three stages are connected. Alternately, the power amplification FETs may be constructed in two stages or four or larger stages. The FETs in the second and third stages may be constructed by two FETs formed in parallel. Further, in the foregoing embodiment, the high frequency power amplification unit and the front end unit are constructed as the different modules 200 and 400. Alternately, the modules 200 and 400 may be constructed as a single module.

In the above description, mainly, the case where the invention achieved by the inventor herein is applied to the power module as a component of the dual-mode wireless communication system capable of performing transmission and reception in the two communication systems of GSM and DCS as the field as the background of the invention has been described. However, the invention is not limited to the case but can be also applied to a power module as a component of a wireless communication system such as a multi-mode portable telephone, a mobile telephone, or the like capable of performing transmission and reception in the other communication system or in three or more communication systems of GMS, DCS, PCS (Personal Communications System), and the like.

Effects obtained by representative inventions in the inventions disclosed in the specification will be briefly described as follows.

According to the invention, in a wireless communication system in which an output level necessary for an output power feedback control is detected in a current detecting method, a change in the output power accompanying a fluctuation in a load is reflected in a detected current of the output level detecting circuit. Thus, the output power can be controlled more accurately and occurrence of undesired situations such as destroy of an element in a circuit and considerable exhaustion of a battery due to a temporary increase in current consumption can be avoided.

What is claimed is:

1. A high frequency power amplification electric part comprising:
   a power amplification circuit for amplifying a modulated high frequency signal;
   a first transistor for detecting an output of the power amplification circuit by receiving a signal input to the power amplification circuit;
   a current mirror circuit for generating a first current in proportion to a second current of the first transistor; and
   a bias generating circuit for supplying a bias to said power amplification circuit in accordance with the first current,
   wherein a first capacitive element for transmitting variation of said output of said power amplification circuit is coupled between an output terminal of said power amplification circuit and a control terminal of a second transistor included in said current mirror circuit for receiving the second current.

2. The high frequency power amplification electric part according to claim 1, wherein an impedance matching circuit and a second capacitive element for blocking direct current are coupled between said output terminal of said power amplification circuit and the output terminal, and one end of said first capacitive element is coupled to any one of nodes between said output terminal of the power amplification circuit and said second capacitive element.

3. The high frequency power amplification electric part according to claim 1, wherein said first transistor and said current mirror circuit are formed on a same semiconductor chip, the semiconductor chip and said power amplification circuit are mounted on an insulating substrate, and said first capacitive element is constructed by a dielectric layer formed on said insulating substrate and a pair of conductive layers formed so as to sandwich the dielectric layer.

4. The high frequency power amplification electric part according to claim 1, wherein said first capacitive element has a capacitance value of at least 1 pF.

5. The high frequency power amplification electric part according to claim 1, further comprising a resistive element for converting the first current transferred from said current mirror circuit into a voltage.

6. The high frequency power amplification electric part according to claim 5, further comprising a comparing circuit for comparing the voltage obtained by conversion of said resistive element with an output level instruction signal and outputting a signal according to the difference of the voltage and the output level instruction signal, wherein the bias generating circuit generates said bias to said power amplification circuit in accordance with an output of the comparing circuit.

7. The high frequency power amplification electric part according to claim 1, wherein said power amplification circuit includes a field effect transistor, and the bias is supplied to the gate terminal of said field effect transistor.

8. The high frequency power amplification electric part according to claim 1, wherein said power amplification circuit has a plurality of amplifying stages coupled in cascade, a final stage of the plurality of amplifying stages is formed on a first semiconductor chip, the amplifying stages other than the final stage are formed on a second semiconductor chip, and said first transistor and said current mirror circuit are formed on a third semiconductor chip.

9. The high frequency power amplification electric part according to claim 1, wherein said power amplification circuit has a plurality of amplifying stages coupled in cascade, a final stage of the plurality of amplifying stages, said first transistor and said current mirror circuit are formed on a first semiconductor chip, and said amplifying stages other than the final stage are formed on a second semiconductor chip.

10. The high frequency power amplification electric part according to claim 1, wherein a resistive element is coupled between an input terminal of said power amplification circuit and a control terminal of said first transistor.

11. The high frequency power amplification electric part according to claim 1, wherein a resistive element is coupled between said first transistor and said second transistor.

12. A wireless communication system comprising:
    a high frequency power amplification electric part according to claim 1;
    a second electric part having a transmission/reception switching circuit for switching between a transmission signal and a reception signal;
    a third electric part for modulating a signal to be transmitted and supplying the modulated signal to said high frequency power amplification electric part; and
    a semiconductor integrated circuit for supplying an output level instruction signal to said high frequency power amplification electric part.

13. The wireless communication system according to claim 12, wherein said high frequency power amplification electric part has a first power amplification circuit for amplifying a signal in a first frequency band and a second power amplification circuit for amplifying a signal in a second frequency band,
    said second electric part has signal switching means for switching between a signal in the first frequency band and the signal in the second frequency band, and
    said third electric part has a circuit for modulating the signal in the first frequency band and a circuit for modulating a signal in the second frequency band.

14. A high frequency power amplification electric part comprising:
    a power amplification circuit having input and output terminals, the input terminal for receiving a high freciuency signal as an input signal and outputting a signal according to the input signal;
    a detecting circuit having a transistor for output detection which receives the input signal from the power amplification circuit, and forming an output signal according to said input signal;
    a bias generating circuit for applying a bias according to the output signal of the detecting circuit to said power amplification circuit; and a first capacitive element for transmitting fluctuation in said output terminal to said detecting circuit, which is connected between the output terminal of said power amplification circuit and said detecting circuit.

15. The high frequency power amplification electric part according to claim 14, wherein an impedance matching circuit and a second capacitive element for blocking direct current are connected between the output terminal of said power amplification circuit and a terminal to which an antenna is to be connected, and one of terminals of said first capacitive element is coupled between the output terminal of the power amplification circuit and said second capacitive element for blocking direct current.

16. A wireless communication system comprising:
a high frequency power amplification electric part according to claim 14;
a second electric part having a transmission/reception switching circuit for switching between a transmission signal and a reception signal;
a third electric part for modulating a signal to be transmitted and supplying the modulated signal to said high frequency power amplification electric part; and
a semiconductor integrated circuit for supplying an output level instruction signal to said high frequency power amplification electric part.

* * * * *